United States Patent
Lee

(10) Patent No.: US 11,382,360 B2
(45) Date of Patent: Jul. 12, 2022

(54) AEROSOL GENERATING DEVICE AND METHOD OF ESTIMATING BATTERY LIFE THEREOF

(71) Applicant: KT&G CORPORATION, Daejeon (KR)

(72) Inventor: Jae Min Lee, Siheung-si (KR)

(73) Assignee: KT&G CORPORATION, Daejeon (KR)

( * ) Notice: Subject to any disclaimer, the term of this patent is extended or adjusted under 35 U.S.C. 154(b) by 128 days.

(21) Appl. No.: 16/967,300

(22) PCT Filed: Mar. 16, 2020

(86) PCT No.: PCT/KR2020/003610
§ 371 (c)(1),
(2) Date: Aug. 4, 2020

(87) PCT Pub. No.: WO2020/190002
PCT Pub. Date: Sep. 24, 2020

(65) Prior Publication Data
US 2021/0227891 A1    Jul. 29, 2021

(30) Foreign Application Priority Data

Mar. 19, 2019   (KR) .......................... 10-2019-0031470

(51) Int. Cl.
*G01R 31/392* (2019.01)
*A24F 40/53* (2020.01)
(Continued)

(52) U.S. Cl.
CPC .............. *A24F 40/53* (2020.01); *A24F 40/20* (2020.01); *G01R 31/392* (2019.01); *H05B 1/0244* (2013.01)

(58) Field of Classification Search
CPC ....... A24F 40/53; A24F 40/20; G01R 31/392; H05B 1/0244
See application file for complete search history.

(56) References Cited

U.S. PATENT DOCUMENTS

| 10,338,153 B2 | 7/2019 | Adagouda Patil et al. |
| 2002/0021108 A1 | 2/2002 | Suzuki et al. |

(Continued)

FOREIGN PATENT DOCUMENTS

| JP | 9-68561 A | 3/1997 |
| KR | 2001-0113491 A | 12/2001 |

(Continued)

OTHER PUBLICATIONS

International Search Report in International Application No. PCT/KR2020/003610, dated Oct. 7, 2020.

(Continued)

*Primary Examiner* — Raymond L Nimox
(74) *Attorney, Agent, or Firm* — Sughrue Mion, PLLC

(57) ABSTRACT

Provided is an aerosol generating device having a function of estimating battery life, the aerosol generating device including a heater configured to generate an aerosol by heating an aerosol generating substance; a battery configured to supply power to the heater; a counter configured to count the number of usage times the aerosol generating device is used by a user; and a controller configured to control power supplied to the heater, wherein the controller estimates a remaining life of the battery based on at least two from among an initial output voltage of the battery, an output voltage of the battery dropped as the aerosol generating device is used for a counted number of usage times, and the counted number of usage times.

20 Claims, 4 Drawing Sheets

(51) Int. Cl.
*A24F 40/20* (2020.01)
*H05B 1/02* (2006.01)

(56) References Cited

U.S. PATENT DOCUMENTS

| | | | |
|---|---|---|---|
| 2002/0086068 | A1 | 7/2002 | Bandyopadhyay et al. |
| 2014/0338685 | A1* | 11/2014 | Amir .................. A24F 40/53 |
| | | | 131/329 |
| 2015/0101625 | A1 | 4/2015 | Newton et al. |
| 2016/0057811 | A1* | 2/2016 | Alarcon .................. A24F 40/50 |
| | | | 219/494 |
| 2017/0027234 | A1* | 2/2017 | Farine ................. H01M 10/488 |
| 2019/0011505 | A1 | 1/2019 | Park et al. |
| 2019/0320717 | A1* | 10/2019 | Tabasso ............... H05B 1/0297 |
| 2020/0037668 | A1* | 2/2020 | Robert .................. A24F 40/50 |
| 2020/0086068 | A1 | 3/2020 | Lee et al. |
| 2020/0275707 | A1* | 9/2020 | Courbat ................. A24F 40/53 |

FOREIGN PATENT DOCUMENTS

| | | |
|---|---|---|
| KR | 10-2011-0076648 A | 7/2011 |
| KR | 10-2015-0054162 A | 5/2015 |
| KR | 10-2016-0107095 A | 9/2016 |
| KR | 10-1701377 B1 | 2/2017 |
| KR | 10-2017-0079689 A | 7/2017 |
| KR | 10-2018-0070443 A | 6/2018 |
| KR | 10-2018-0114825 A | 10/2018 |
| WO | 2014/190079 A2 | 11/2014 |

OTHER PUBLICATIONS

Communication dated Sep. 14, 2020, issued by the Korean Intellectual Property Office in application No. 10-2019-0031470.
Office Action dated Sep. 21, 2021 in Japanese Application No. 2020-548791.
Extended European Search Report dated Mar. 25, 2022 in European Application No. 20743574.4.

* cited by examiner

[Fig. 1]
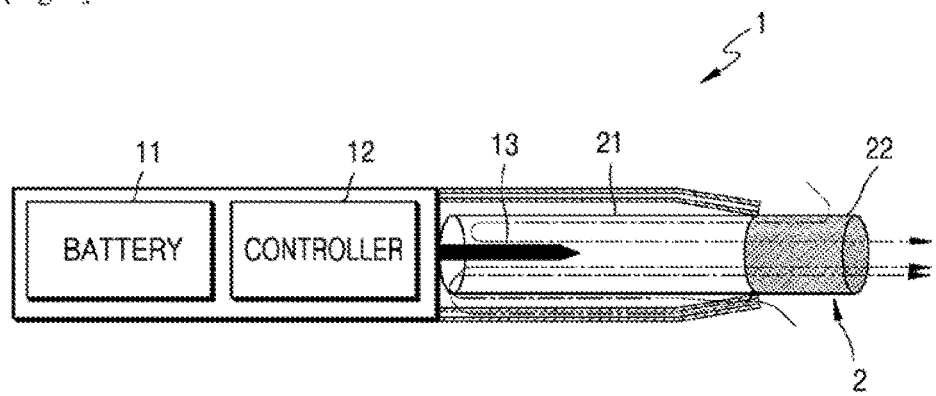
[Fig. 2]
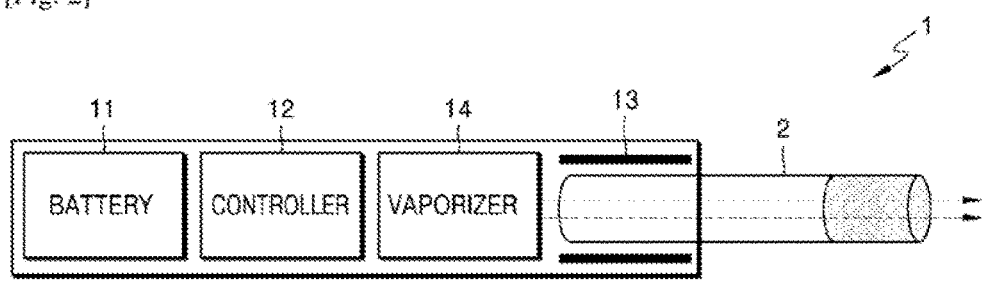
[Fig. 3]
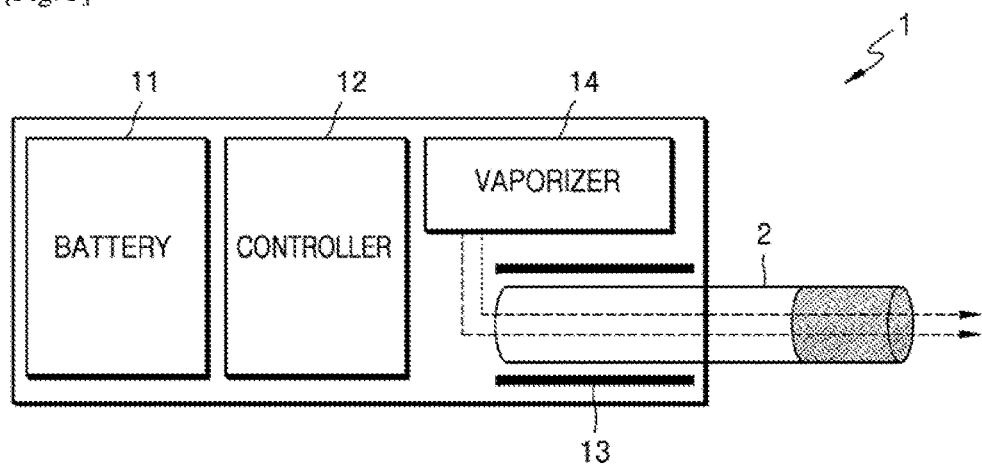
[Fig. 4]
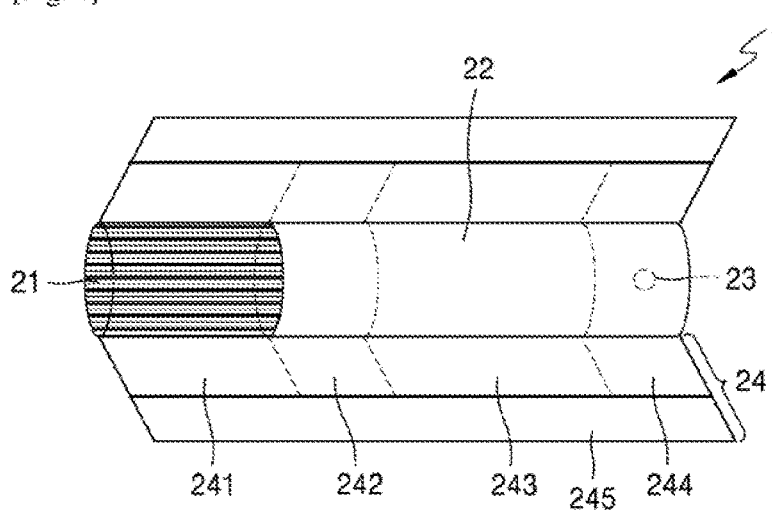

[Fig. 5]
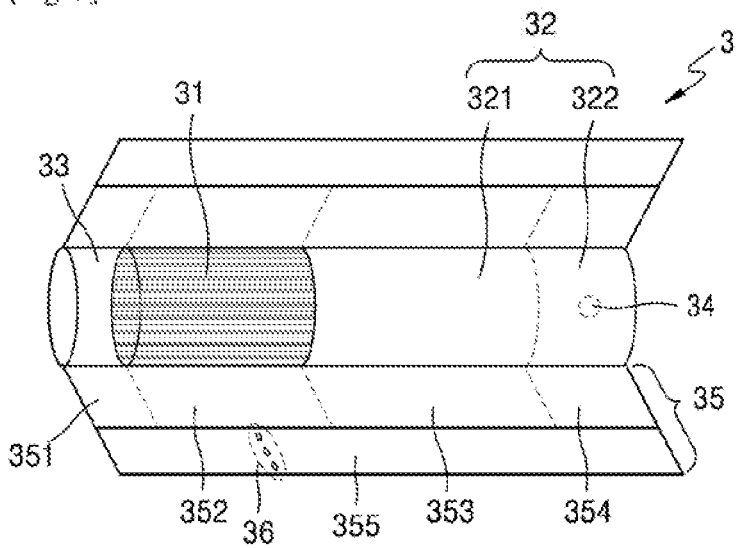
[Fig. 6]
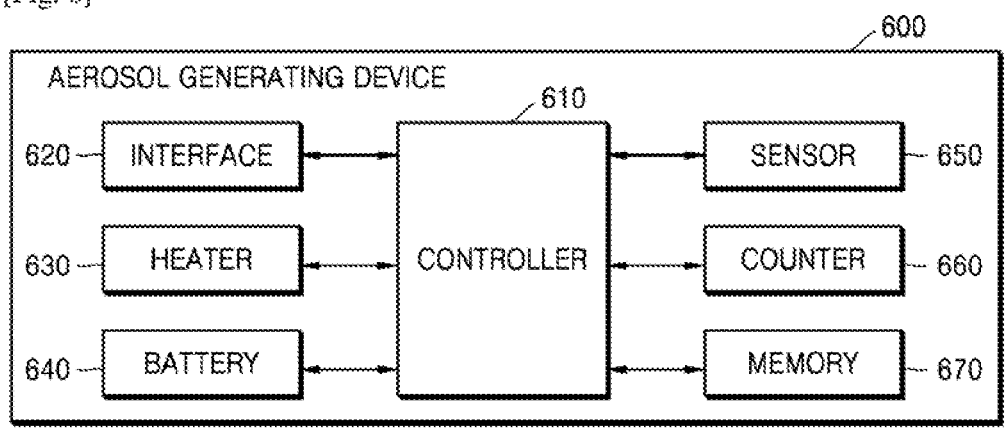
[Fig. 7]
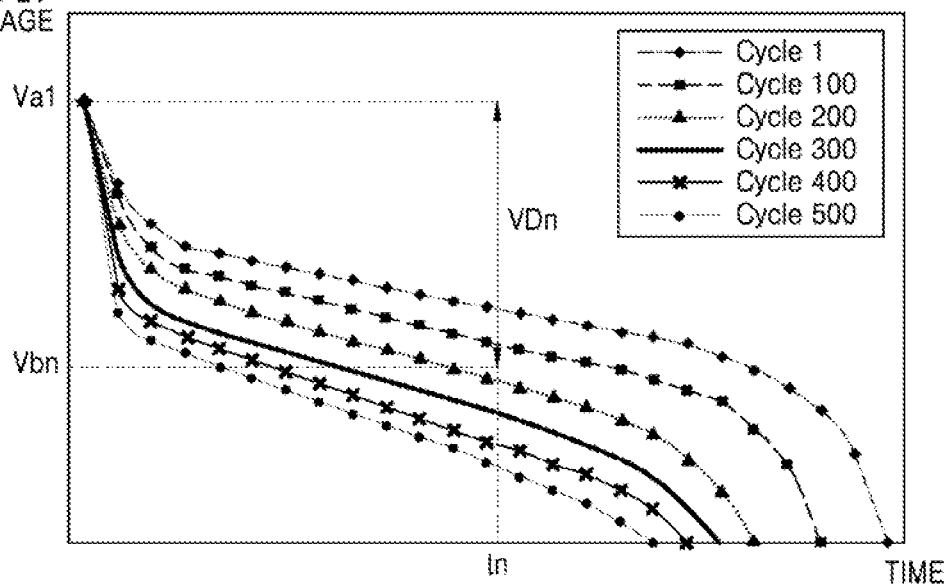

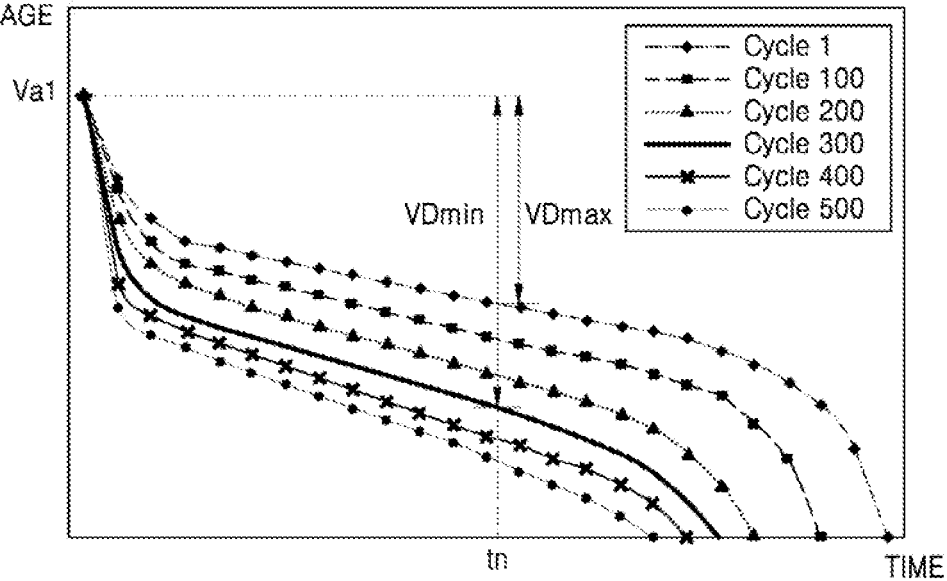
[Fig. 8]
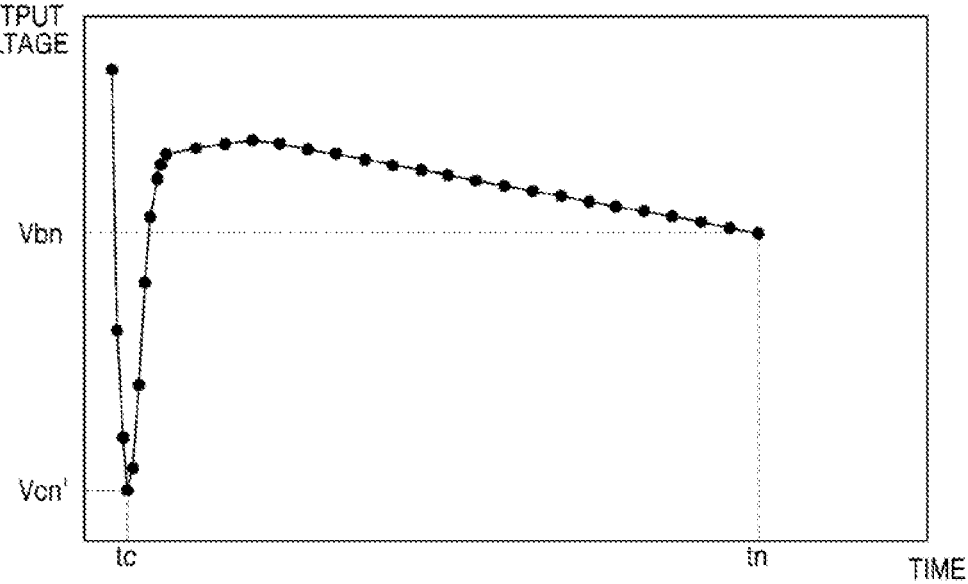
[Fig. 9]

[Fig. 10]
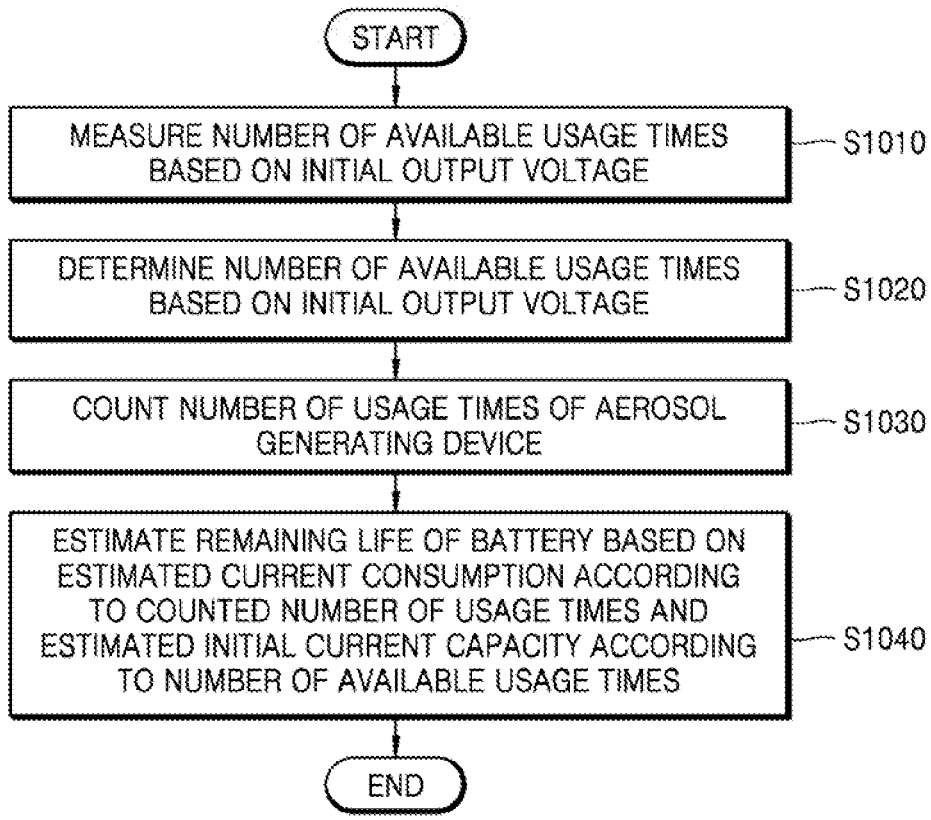
[Fig. 11]
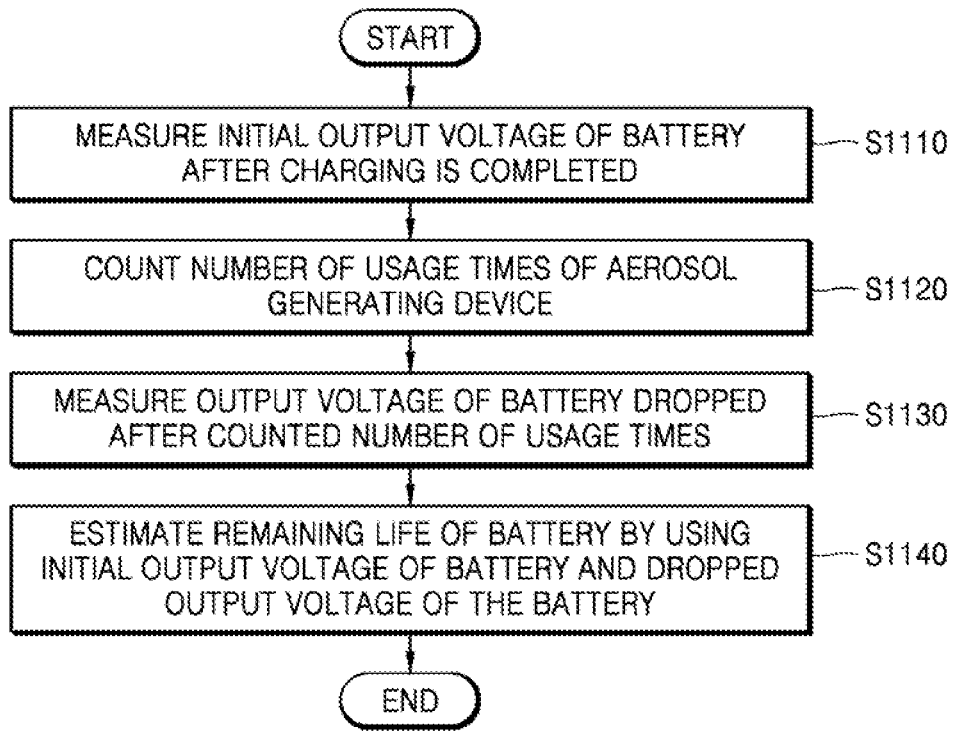

AEROSOL GENERATING DEVICE AND METHOD OF ESTIMATING BATTERY LIFE THEREOF

CROSS-REFERENCE TO RELATED APPLICATIONS

This application is a National Stage of International Application No. PCT/KR2020/003610 filed on Mar. 16, 2020, which claims priority under U.S.C. § 119(a) to Korean Patent Application No. 10-2019-0031470 filed on Mar. 19, 2019.

TECHNICAL FIELD

The present disclosure relates to an aerosol generating device and a method of estimating battery life thereof.

BACKGROUND ART

Recently, there is a growing demand for alternative methods for resolving problems of a regular combustion-type cigarette. For example, there is an increasing demand for a method of generating aerosol by heating an aerosol generating material in cigarettes, rather than by burning cigarettes. In this regard, researches on heating-type cigarettes and heating type aerosol generating apparatuses are being actively carried out.

A heating-type aerosol generating device includes a heater for heating an aerosol generating material and a battery for supplying power to the heater. Since the heater plays a key role in the aerosol generating device, the performance of the battery may directly affect smoking quality. Therefore, it is necessary to estimate the life of the battery to ensure a good smoking quality.

DISCLOSURE OF INVENTION

Technical Problem

One or more exemplary embodiments provide a method of effectively estimating battery life of an aerosol generating device and an aerosol generating device having a function of estimating battery life according to the method.

Additional aspects will be set forth in part in the description which follows and, in part, will be apparent from the description, or may be learned by practice of the presented exemplary embodiments of the disclosure.

Solution to Problem

According to one or more exemplary embodiments, an aerosol generating device includes a heater configured to generate aerosol by heating an aerosol generating substance; a battery configured to supply power to the heater; and a controller configured to estimate a remaining life of the battery based on at least two from among a first output voltage of the battery measured at a first time point, a second output voltage of the battery measured at a second time point that is later than the first time point, and a number of usage times of the aerosol generating device between the first time point and the second time point.

According to one or more exemplary embodiments, a method of estimating battery life of an aerosol generating device includes measuring an initial output voltage of a battery; determining a number of available usage times of the aerosol generating device based on the initial output voltage of the battery; counting a number of usage times of the aerosol generating device; and estimating the remaining life of the battery based on an estimated current consumption of the aerosol generating device according to the number of usage times and an estimated initial current capacity of the aerosol generating device according to the number of available usage times.

According to one or more exemplary embodiments, a method of estimating battery life of an aerosol generating device includes measuring a first output voltage of a battery at a first time point; counting a number of usage times of the aerosol generating device; measuring a second output voltage of the battery at a second time point after the number of usage times; and estimating the remaining life of the battery based on the first output voltage and the second output voltage.

Advantageous Effects of Invention

According to the present invention, it is possible to effectively estimate the remaining battery life of the aerosol generating device. And, it is possible to prevent the deterioration of smoking quality due to the battery performance to a certain level or more, and to maintain the smoking quality uniformly.

BRIEF DESCRIPTION OF DRAWINGS

The above and other aspects, features, and advantages of certain exemplary embodiments of the disclosure will be more apparent from the following description taken in conjunction with the accompanying drawings, in which:

FIGS. 1 to 3 are diagrams showing examples in which a cigarette is inserted into an aerosol generating device;

FIGS. 4 and 5 are diagrams showing examples of cigarettes;

FIG. 6 is a block diagram showing a configuration of an aerosol generating device according to an exemplary embodiment;

FIG. 7 is a diagram showing a graph of the output voltage of a battery and the voltage of the battery dropped as an aerosol generating device is used for a predetermined number of times, according to an exemplary embodiment;

FIG. 8 is a diagram showing a graph of the output voltage of a battery and estimated voltage drops for respective performance states of the battery;

FIG. 9 is a diagram showing an output voltage graph of a battery that is discharged at a predetermined discharging rate or a higher rate while an aerosol generating device is being used once;

FIG. 10 is a flowchart of a method of estimating battery life of an aerosol generating device according to an exemplary embodiment; and FIG. 11 is a flowchart of a method of estimating battery life of an aerosol generating device according to an exemplary embodiment.

BEST MODE FOR CARRYING OUT THE INVENTION

According to one or more exemplary embodiments, an aerosol generating device includes a heater configured to generate aerosol by heating an aerosol generating substance; a battery configured to supply power to the heater; and a controller configured to estimate a remaining life of the battery based on at least two from among a first output voltage of the battery measured at a first time point, a second output voltage of the battery measured at a second time point that is later than the first time point, and a number of usage times of the aerosol generating device between the first time point and the second time point.

MODE FOR THE INVENTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

With respect to the terms used to describe the various exemplary embodiments, general terms which are currently and widely used are selected in consideration of functions of structural elements in the various exemplary embodiments of the present disclosure. However, meanings of the terms can be changed according to intention, a judicial precedence, the appearance of new technology, and the like. In addition, in certain cases, there is also a term arbitrarily selected by the applicant, in which case the meaning will be described in detail in the description of one or more exemplary embodiments. Therefore, the terms used in one or more exemplary embodiments should be defined based on the meanings of the terms and the general contents of one or more exemplary embodiments, rather than simply the names of the terms.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Hereinafter, exemplary embodiments of the present invention will be described in detail with reference to the accompanying drawings. The inventive concept may, however, be embodied in many different forms and should not be construed as being limited to the exemplary embodiments set forth herein.

FIGS. 1 to 3 are diagrams showing examples in which a cigarette is inserted into an aerosol generating device.

Referring to FIG. 1, the aerosol generating device 1 may include a battery 11, a controller 12, and a heater 13. Referring to FIGS. 2 and 3, the aerosol generating device 1 may further include a vaporizer 14. Also, the cigarette 2 may be inserted into an inner space of the aerosol generating device 1.

FIGS. 1 through 3 illustrate components of the aerosol generating device 1, which are related to the present exemplary embodiment. Therefore, it will be understood by one of ordinary skill in the art related to the present exemplary embodiment that other components may be further included in the aerosol generating device 1, in addition to the components illustrated in FIGS. 1 through 3.

Also, FIGS. 2 and 3 illustrate that the aerosol generating device 1 includes the heater 13. However, as necessary, the heater 13 may be omitted.

FIG. 1 illustrates that the battery 11, the controller 12, and the heater 13 are arranged in series. Also, FIG. 2 illustrates that the battery 11, the controller 12, the vaporizer 14, and the heater 13 are arranged in series. Also, FIG. 3 illustrates that the vaporizer 14 and the heater 13 are arranged in parallel. However, the internal structure of the aerosol generating device 1 is not limited to the structures illustrated in FIGS. 1 through 3. In other words, according to the design of the aerosol generating device 1, the battery 11, the controller 12, the heater 13, and the vaporizer 14 may be differently arranged.

When the cigarette 2 is inserted into the aerosol generating device 1, the aerosol generating device 1 may operate the heater 13 and/or the vaporizer 14 to generate aerosol from the cigarette 2 and/or the vaporizer 14. The aerosol generated by the heater 13 and/or the vaporizer 14 is delivered to a user by passing through the cigarette 2.

According to necessity, even when the cigarette 2 is not inserted into the aerosol generating device 1, the aerosol generating device 1 may heat the heater 13.

The battery 11 may supply power to be used for the aerosol generating device 1 to operate. For example, the battery 11 may supply power to heat the heater 13 or the vaporizer 14, and may supply power for operating the controller 12. Also, the battery 11 may supply power for operations of a display, a sensor, a motor, etc. mounted in the aerosol generating device 1.

The controller 12 may generally control operations of the aerosol generating device 1. In detail, the controller 12 may control not only operations of the battery 11, the heater 13, and the vaporizer 14, but also operations of other components included in the aerosol generating device 1. Also, the controller 12 may check a state of each of the components of the aerosol generating device 1 to determine whether or not the aerosol generating device 1 is able to operate.

The controller 12 may include at least one processor. A processor can be implemented as an array of a plurality of logic gates or can be implemented as a combination of a microprocessor and a memory in which a program executable in the microprocessor is stored. It will be understood by one of ordinary skill in the art that the processor can be implemented in other forms of hardware.

The heater 13 may be heated by the power supplied from the battery 11. For example, when the cigarette 2 is inserted into the aerosol generating device 1, the heater 13 may be located outside the cigarette 2. Thus, the heated heater 13 may increase a temperature of an aerosol generating material in the cigarette 2.

The heater 13 may include an electro-resistive heater. For example, the heater 13 may include an electrically conductive track, and the heater 13 may be heated when currents flow through the electrically conductive track. However, the heater 13 is not limited to the example described above and may include all heaters which may be heated to a desired temperature. Here, the desired temperature may be pre-set in the aerosol generating device 1 or may be set as a temperature desired by a user.

As another example, the heater 13 may include an induction heater. In, detail, the heater 13 may include an electrically conductive coil for heating a cigarette in an induction heating method, and the cigarette may include a susceptor which may be heated by the induction heater.

For example, the heater 13 may include a tube-type heating element, a plate-type heating element, a needle-type heating element, or a rod-type heating element, and may beat the inside or the outside of the cigarette 2, according to the shape of the heating element.

Also, the aerosol generating device 1 may include a plurality of heaters 13. Here, the plurality of heaters 13 may be inserted into the cigarette 2 or may be arranged outside the cigarette 2. Also, some of the plurality of heaters 13 may be inserted into the cigarette 2 and the others may be arranged outside the cigarette 2. In addition, the shape of the heater 13 is not limited to the shapes illustrated in FIGS. 1 through 3 and may include various shapes.

The vaporizer 14 may generate aerosol by heating a liquid composition and the generated aerosol may pass through the cigarette 2 to be delivered to a user. In other words, the aerosol generated via the vaporizer 14 may move along an air flow passage of the aerosol generating device 1 and the air flow passage may be configured such that the aerosol generated via the vaporizer 14 passes through the cigarette 2 to be delivered to the user.

For example, the vaporizer 14 may include a liquid storage, a liquid delivery element, and a heating element, but it is not limited thereto. For example, the liquid storage, the liquid delivery element, and the heating element may be included in the aerosol generating device 1 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14 or may be formed integrally with the vaporizer 14.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14 may be referred to as a cartomizer or an atomizer, but it is not limited thereto.

The aerosol generating device 1 may include other components in addition to the battery 11, the controller 12, the heater 13, and the vaporizer 14. For example, the aerosol generating device 1 may include a display capable of outputting visual information and/or a motor for outputting haptic information. Also, the aerosol generating device 1 may include at least one sensor (e.g., a puff detecting sensor, a temperature detecting sensor, a cigarette insertion detecting sensor, etc.). Also, the aerosol generating device 1 may be formed as a structure where, even when the cigarette 2 is inserted into the aerosol generating device 1, external air may be introduced or internal air may be discharged.

Although not illustrated in FIGS. 1 through 3, the aerosol generating device 1 and an additional cradle may form together a system. For example, the cradle may be used to charge the battery 11 of the aerosol generating device 1. Alternatively, the heater 13 may be heated when the cradle and the aerosol generating device 1 are coupled to each other.

The cigarette 2 may be similar to a general combustive cigarette. For example, the cigarette 2 may be divided into a first portion including an aerosol generating material and a second portion including a filter, etc. Alternatively, the second portion of the cigarette 2 may also include an aerosol generating material. For example, an aerosol generating material made in the form of granules or capsules may be inserted into the second portion.

The entire first portion may be inserted into the aerosol generating device 1, and the second portion may be exposed to the outside. Alternatively, only a portion of the first portion may be inserted into the aerosol generating device 1. Otherwise, the entire first portion and a portion of the second portion may be inserted into the aerosol generating device 1. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 1. For example, opening and closing of the air passage and/or a size of the air passage may be adjusted by the user. Accordingly, the amount and smoothness of smoke may be adjusted by the user. As another example, the external air may flow into the cigarette 2 through at least one hole formed in a surface of the cigarette 2.

Hereinafter, an example of the cigarette 2 will be described with reference to FIGS. 4 and 5.

FIGS. 4 and 5 are diagrams showing examples of cigarettes.

Referring to FIG. 4, the cigarette 2 may include a tobacco rod 21 and a filter rod 22. The first portion 21000 described above with reference to FIGS. 1 through 3 may include the tobacco rod, and the second portion may include the filter rod 22.

FIG. 4 illustrates that the filter rod 22 includes a single segment. However, the filter rod 22 is not limited thereto. In other words, the filter rod 22 may include a plurality of segments. For example, the filter rod 22 may include a first segment configured to cool an aerosol and a second segment configured to filter a certain component included in the aerosol. Also, as necessary, the filter rod 22 may further include at least one segment configured to perform other functions.

The cigarette 2000 may be packaged using at least one wrapper 24. The wrapper 24 may have at least one hole through which external air may be introduced or internal air may be discharged. For example, the cigarette 2 may be packaged using one wrapper 24. As another example, the cigarette 2 may be double-packaged using at least two wrappers 24. For example, the tobacco rod 21 may be packaged using a first wrapper 241, and the filter rod 22 may be packaged using wrappers 242, 243, 244. In addition, the cigarette 2 may be repackaged by a single wrapper 245. When each of the tobacco rod 21 and the filter rod 22 includes a plurality of segments, each segment may be packaged using wrappers 242, 243, 244.

The tobacco rod 21 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21 may include other additives, such as flavors, a wetting agent, and/or organic acid. Also, the tobacco rod 21 may include a flavored liquid, such as menthol or a moisturizer, which is injected to the tobacco rod 21.

The tobacco rod 21 may be manufactured in various forms. For example, the tobacco rod 21 may be formed as a sheet or a strand. Also, the tobacco rod 21 may be formed as a pipe tobacco, which includes tiny bits cut from a tobacco sheet.

The tobacco rod 21 may be surrounded by a heat conductive material. For example, the heat-conducting material may be, but is not limited to, a metal foil such as aluminum foil. For example, the heat conductive material surrounding the tobacco rod 21 may uniformly distribute heat transmitted to the tobacco rod 21, and thus, the heat conductivity of the tobacco rod may be increased. As a result, the taste of the tobacco may be improved. Also, the heat conductive material surrounding the tobacco rod 21 may function as a susceptor heated by the induction heater. Here, although not illustrated in the drawings, the tobacco rod 21 may further include an additional susceptor, in addition to the heat conductive material surrounding the tobacco rod 21.

The filter rod 22 may include a cellulose acetate filter. Shapes of the filter rod 22 are not limited. For example, the filter rod 22 may include a cylinder-type rod or a tube-type rod having a hollow inside. Also, the filter rod 22 may include a recess-type rod. When the filter rod 22 includes a plurality of segments, at least one of the plurality of segments may have a different shape.

Also, the filter rod 22 may include at least one capsule 23. Here, the capsule 23 may generate a flavor or an aerosol. For example, the capsule 23 may have a configuration in which a liquid containing a flavoring material is wrapped with a film. For example, the capsule 23 may have a spherical or cylindrical shape, but is not limited thereto.

Referring to FIG. 5, the cigarette 3 may include a front-end plug 33. The front-end plug 33 may be located on a side of the tobacco rod 31, the side not facing the filter rod 32. The front-end plug 33 may prevent the tobacco rod 31 from being detached and may prevent the liquefied aerosol from flowing from the tobacco rod 31 into an aerosol generating device during smoking.

The filter rod 32 may include a first segment 321 and a second segment 322. Here, the first segment 321 may correspond to the first segment of the filter rod 22 of FIG. 4, and the second segment 322 may correspond to the third segment of the filter rod 22 of FIG. 4.

The diameter and the total length of the cigarette 3 may correspond to the diameter and the total length of the cigarette 2 of FIG. 4.

The cigarette 3 may be wrapped by at least one wrapper 35. At least one hole through which outside air flows in or inside gas flows out may be formed in the wrapper 35. For example, the front-end plug 33 may be wrapped by a first wrapper 351, the tobacco rod 31 may be wrapped by a second wrapper 352, the first segment 321 may be wrapped by a third wrapper 353, and the second segment 322 may be wrapped by a fourth wrapper 354. Also, the entire cigarette 3 may be re-wrapped by a fifth wrapper 355.

Also, at least one perforation 36 may be formed in the fifth wrapper 355. For example, the perforation 36 may be formed in a region surrounding the tobacco rod 31, but is not limited thereto. The perforation 36 may serve to transfer heat generated by the heater 13 shown in FIGS. 2 and 3 into tobacco rod 31.

Also, the second segment 322 may include at least one capsule 34. Here, the capsule 34 may serve to generate a flavor or serve to generate an aerosol. For example, the capsule 34 may have a structure that a liquid containing perfume is wrapped in a film. The capsule 34 may have a spherical or cylindrical shape, but is not limited thereto.

FIG. 6 is a block diagram showing a configuration of an aerosol generating device 600 according to an exemplary embodiment.

The aerosol generating device 600 may include a controller 610, an interface 620, a heater 630, a battery 640, a sensor 650, a counter 660, and a memory 670. However, the aerosol generating device 600 may be implemented by more or fewer components than those shown in FIG. 6. The controller 610, the heater 630, and the battery 640 may be the same as the controller 12, the heater 13, and the battery 11 of FIGS. 1 to 3, and the descriptions given above with reference to FIGS. 1 to 3 may be applied thereto.

The controller 610 controls overall operations of the aerosol generating device 600. For example, the controller 610 may analyze and process data obtained by the sensor 650 and the counter 660. The controller 610 may start or stop supplying power from the battery 640 to the heater 630 according to the sensed data. Also, the controller 610 may control an amount of power supplied to the heater 630 and a time for supplying the power, such that the heater 630 may be heated to a predetermined temperature or maintained at a proper temperature. Also, the controller 610 may process various input information and output information of the interface 620.

The controller 610 may estimate the remaining life of the battery 640 by using data output by the sensor 650 and the counter 660, and/or data stored in the memory 670. According to an exemplary embodiment, the controller 610 may estimate the remaining life, of the battery 640 based on at least two from among an initial output voltage of the battery 640 at a first time point, a current output voltage of the battery 640 at a second time point that is later than the first time point, and the number of usage times of the aerosol generating device 600 between the first time point and the second time point, which is counted by the counter 660.

The controller 610 may output an estimation result for the remaining life of the battery 640 through the interface 620. For example, the controller 610 may output an estimation result for the remaining life of the battery 640 in various forms. For example, the controller 610 may output a number indicating the remaining life of the battery 640 or a warning message that the remaining life of the battery 640 is out of a normal operation range using visual, auditory, and/or tactile information through the interface.

The interface 620 may include various interfacing units including input/output (I/O) interfacing units (e.g., buttons or a touch screen) for receiving inputs from a user or outputting information to the user, such as a display or a lamp for outputting visual information, a motor for outputting tactile information, a speaker for outputting auditory information, terminals for performing data communication with or receiving power, and communication interfacing modules for performing a wireless communication (e.g., Wi-Fi, Wi-Fi Direct, Bluetooth, near-field communication (NFC), etc.) with external devices. However, the aerosol generating device 600 may be implemented by selecting only some of the various interfacing units stated above.

The heater 630 may be electrically heated by power supplied from the battery 640 under the control of the controller 610. The heater 630 generates aerosol by heating an aerosol generating substance.

The battery 640 supplies power used to operate the aerosol generating device 600. In particular, the battery 640 may supply power for heating the heater 630. Also, the battery 640 may supply power for operations of the other hardware components included in the aerosol generating device 600, such as the controller 610, the interface 620, the sensor 650, and the counter 660.

The sensor 650 may include various types of sensors, such as a puff detect sensor (e.g., a temperature sensor, a flow sensor, a position sensor, a pressure sensor, etc.), a cigarette insertion detecting sensor, a voltage sensor for measuring an output voltage of the battery 640, a current sensor for measuring a discharge current of the battery 640, and a temperature sensor of the heater 630. Data sensed by the sensor 650 is transmitted to the controller 610, and the controller 610 may control the aerosol generating device 600 to perform various functions, such as estimating a remaining life of a battery, controlling a temperature of a heater, restricting, smoking, determining whether a cigarette is inserted, and displaying a notification.

The counter 660 counts the number of usage times of the aerosol generating device 600. The counter 660 according to an exemplary embodiment may detect that the aerosol generating device 600 is used based on data sensed by the sensor 650, and count the number of usage times of the aerosol generating device 600.

According to an exemplary embodiment, the counter 660 may count the number of usage times of aerosol generating device 600 based on the number of puffs of a user which may be detected by a puff detecting sensor. For example, the counter 660 may determine that the aerosol generating device 600 is used once (i.e., one usage time is counted) when the number of puffs detected within a predetermined time period exceeds a predetermined number.

In another exemplary embodiment, the counter 660 may count the number of usage times of the aerosol generating device 600 based on a temperature change of the heater 630 which is sensed by a temperature sensor. For example, the counter 660 may count the number of usage times of the aerosol generating device 600 based on a temperature change of the heater 630 and a temperature profile stored in the memory 670.

In the above-described exemplary embodiments, the counter 660 may add one usage time of the aerosol generating device 600 when a predetermined time elapsed since the heater 630 began to be pre-heated or reached a predetermined temperature by pre-heating. However, the method by which the counter 660 counts the number of usage times of the aerosol generating device 600 is not limited to the above examples.

Although the counter 660 is shown as a separate component from the controller 610 in FIG. 6, the counter 660 may be physically or logically embedded in the controller 610 or other element.

The memory 670 is a hardware component for storing various data processed in the aerosol generating device 600. The memory 670 may store data processed by the controller 610 and data to be processed by the controller 610. The memory 670 may include various types of memories, e.g., a random access memory (RAM), such as a dynamic random access memory (DRAM) and a static random access memory (SRAM), and a read-only memory (ROM), such as an electrically erasable programmable read-only memory (EEPROM).

According to an exemplary embodiment, the memory 670 may store data used to estimate an output voltage of the battery 640, the number of usage times the aerosol generating device 600 is used counted by the counter 660, and the remaining life of the battery 640.

The controller 610 and the counter 660 of FIG. 6 may be implemented by one or more processors. Therefore, the controller 610 and the counter 660 may be included in other hardware devices, such as a microprocessor or a computer system.

Hereinafter, a method by which the controller 610 estimates the remaining life of the battery 640 according to an exemplary embodiment will be described.

The controller 610 estimates the remaining life of the battery 640 based on at least two from among the initial output voltage of the battery 640 at a first time point, a current output voltage of the battery 640 at a second time point that is later than the first time point, and the number of usage times of the aerosol generating device 600 between the first time point and the second time point. Hereinafter, the initial output voltage of the battery 640 refers to an output voltage of the battery 640 immediately after charging is completed. Here, a charging state of the battery 640 corresponding to the initial output voltage is not necessarily a fully-charged state, and it is sufficient for the battery 640 to be charged to have an output voltage equal to or higher than a predetermined voltage (e.g., 4.0 V).

According to some exemplary embodiments, the controller 610 may estimate the remaining life of the battery 640 based on the number of usage times of the aerosol generating device 600.

In the present exemplary embodiment, the controller 610 may determine the number of available usage times of the aerosol generating device 600 based on the initial output voltage of the battery 640. For example, when the initial output voltage of the battery 640 is measured when the battery 640 is fully charged, the number of available usage times of the aerosol generating device 600 may be a guaranteed number of usage times of the aerosol generating device 600. In another example, when the initial output voltage of the battery 640 is measured when the battery 640 is not fully charged, the number of available usage times of the aerosol generating device 600 may be determined based on a mathematical model that is pre-set according to the characteristics of the battery 640 and the aerosol generating device 600.

The numbers of available usage times of the aerosol generating device 600 according to different output voltages of the battery 640 may be stored in the memory 670 in advance or calculated by the controller 610 based on the mathematical model.

The controller 610 may estimate the remaining life of the battery 640 based on an estimated current consumption corresponding to a counted number of usage times of the aerosol generating device 600 and an estimated initial current capacity corresponding to a determined number of available usage times of the aerosol generating device 600. In an exemplary embodiment, the controller 610 may estimate the remaining life of the battery 640 by comparing a sum of the estimated current consumption based on a counted number of usage times and the standby current consumption indicating a current consumed during a standby time of the aerosol generating device 600, with the estimated initial current capacity. For example, math FIG. 1 below may be used to estimate the remaining life of the battery 640.

$$R_b = N_d \times I_b - (T_w \times I_a + N_c \times I_b)$$ [Math. 1]

In math FIG. 1, Rb denotes a remaining current capacity of the battery. Tw denotes a waiting time, Nc denotes the number of usage times counted by a counter, and Nd denotes the number of available usage times determined based on the initial output voltage of the battery 640.

An estimated current consumption based on a counted number of usage times may be obtained by multiplying an estimated current consumption Ib per use of the aerosol generating device 600 by the counted number of usage times of the aerosol generating device 600.

An estimated initial current capacity corresponding to the number of available usage times may be obtained by multiplying the estimated current consumption Ib per use of the aerosol generating device 600 by the number of available usage times. A current consumed during the standby time of the aerosol generating device 600 may be obtained by multiplying a waiting time (i.e., total idle time after charging of the battery 640 is completed) by a quiescent current Ia per hour.

The remaining life of the battery 640 may be estimated based on the remaining current capacity Rb of the battery 640. When the sum of "Nc*Ib" and "Tw*In" is equal to "Nd*Ib", the controller 610 may determine that the battery 640 is exhausted.

Meanwhile, the controller 610 according to some exemplary embodiments may estimate the remaining life of the battery 640 based on an output voltage of the battery 640 that increases with usage of the aerosol generating device 600.

FIG. 7 is a graph showing that the output voltage of the battery 640 decreases with usage of the aerosol generating device 600. FIG. 8 is a diagram showing a graph of the output voltage of the battery 640 and estimated voltage drops for respective performance states of the battery 640.

As the aerosol generating device 600 is repeatedly used, the output voltage of the battery 640 drops. As the DC resistance of the battery 640 increases due to cycle degradation caused by repeated charging/discharging cycles of the battery 640, the output voltage drop of the battery 640 also becomes more significant as the number of the charging/discharging cycles increases. Accordingly, even when the initial output voltage of the battery 640 is the same, the shorter the remaining life of the battery 640 is (that is, the greater the degree of degradation is), the greater the output voltage drop of the battery 640 becomes for the same time period.

Referring to FIG. 7, when the initial output voltage of the battery 640 is Va1, the output voltage drop for the same time period becomes more significant as the number of charging/discharging cycles increases.

The controller 610 may obtain the initial output voltage Va1 and a dropped output voltage Vbn of the battery 640 sensed by the sensor 650. The dropped output voltage Vbn is an output voltage of the battery 640 dropped after a counted number of usage times (e.g., n times) and indicates an output voltage at a time point tn corresponding to a recent use (e.g., n-th use) of the aerosol generating device 600. The controller 610 may calculate a first voltage drop VDn of the battery 640 by subtracting the dropped output voltage Vbn from the initial output voltage Va1.

The controller 610 may estimate the remaining life of the battery 640 based on a first estimated voltage drop and the first voltage drop VDn of the battery 640.

The first estimated voltage drop may be determined in advance based on the initial output voltage Va1 and a counted number of usage times of the aerosol generating device 600. The first estimated voltage drop may include a first maximum efficiency estimated voltage drop VDmax, which is an estimated voltage drop when the battery 640 is at its peak performance, and a first minimum efficiency estimated voltage drop VDmin, which is an estimated voltage drop when the battery 640 is at its lowest performance.

Referring to FIG. 8, the first maximum efficiency estimated voltage drop VDmax may be determined based on an output voltage graph when the cycle of the battery 640 is 1, and the first lowest efficiency estimated voltage drop VDmin may be determined based on an output voltage graph when the cycle of the battery 640 is 300. However, it is merely an example, and one or more exemplary embodiments are not limited thereto.

The controller 610 may estimate the remaining life of the battery 640 based on the first minimum efficiency estimated voltage drop VDmin, the first maximum efficiency estimated voltage drop VDmax, and the first voltage drop VDn as shown in math FIG. 2.

$$R_1 = \frac{VDmin - VDn}{VDmin - VDmax}$$ [Math. 2]

Math FIG. 2 shows an equation for a first ratio R1 used by the controller 610.

The controller 610 may calculate the first ratio R1, which is a ratio between a value VDmin-VDn obtained by subtracting the first voltage drop VDn from the first minimum efficiency estimated voltage drop VDmin and a value VDmin-VDmax obtained by subtracting the first maximum efficiency estimated voltage drop VDmax from the first minimum efficiency estimated voltage drop VDmin. The controller 610 may estimate the remaining life of the battery 640 based on the first ratio R1. For example, the controller 610 may determine that the remaining life is longer as the value of the first ratio R1 is closer to 1, and determine that the remaining life, is shorter as the value is closer to 0.

FIG. 9 is a graph showing an output voltage of the battery 640 during a single use of the aerosol generating device 600.

The battery 640 according to an exemplary embodiment may have a period during which the battery is discharged at a predetermined discharging rate (e.g., 1C) or higher. This may occur when a large current is consumed within a short period of time. In such a discharging period, the output voltage of the battery 640 drops significantly. In this case, it the remaining life of the battery 640 is not sufficiently long, the output voltage of the battery 640 may drop to a final discharge voltage, and thus the aerosol generating device 600 may not operate normally.

The controller 610 according to an exemplary embodiment may prevent such a problem by estimating the remaining life of the battery 640 by further using a minimum output voltage Vcn' of the battery 640 during as period in which the battery 640 is discharged at a predetermined discharge rate or a higher rate while the aerosol generating device 600 is being used.

In the present exemplary embodiment, the controller 610 may obtain from the sensor 650 the minimum output voltage Vcn' of the battery 640 during a period in which the battery 640 is discharged at a predetermined discharging rate or higher. For example, the period in which the battery 640 is discharged at a predetermined discharging rate or higher may be a period in which the heater 630 performs a pre-heating to heat an aerosol generating substance, but is not limited thereto. For example, the sensor 650 may sense the minimum output voltage Vcn' of the battery 640 during a predetermined time period alter a pre-heating of the heater 630 begins and transmit the minimum output voltage Vcn' to the controller 610.

The controller 610 may calculate a second voltage drop VDn' of the battery 640 in a period in which the battery 640 is discharged at a predetermined discharging rate or a higher rate by subtracting the minimum output voltage Vcn' of the battery 640 from the initial output voltage Va1.

The controller 610 may estimate the remaining life of the battery 640 by using a second estimated voltage drop and the second voltage drop VDn' of the battery 640 in the period in which the battery 640 is discharged at a predetermined discharging rate or a higher rate.

The second estimated voltage drop may be determined in advance based on the initial output voltage Va1 and a predetermined discharging rate. The second estimated voltage drop may include a second maximum efficiency estimated voltage drop VDmax', which is an estimated voltage drop when the battery 640 is at its peak performance, and a second minimum efficiency estimated voltage drop VDmin', which is an estimated voltage drop when the battery 640 is at its lowest performance. For example, the second maximum efficiency estimated voltage drop VDmax' may be determined based on an output voltage graph when the cycle of the battery 640 is 1, and the second lowest efficiency estimated voltage drop VDmin' may be determined based on an output voltage graph when the cycle of the battery 640 is 300. However, one or more exemplary embodiments are not limited thereto.

The controller 610 may estimate the remaining life of the battery 640 by using the second minimum efficiency estimated voltage drop VDmin', the second maximum efficiency estimated voltage drop VDmax', and the second voltage drop VDn' as shown in math FIG. 3.

$$R_2 = \frac{VDmin' - VDn'}{VDmin' - VDmax'} \quad [\text{Math. 3}]$$

Math FIG. 3 shows an equation for a second ratio R4 used by the controller 610.

The controller 610 may calculate the second ratio R2, which is a ratio between a value VDmin'−VDn' obtained by subtracting the second voltage drop VDn' from the second minimum efficiency estimated voltage drop VDmin' and a value VDmin'−VDmax' obtained by subtracting the second maximum efficiency estimated voltage drop VDmax' from the second minimum efficiency estimated voltage drop VDmin'. The controller 610 may estimate the remaining life of the battery 640 based on the second ratio R2. For example, the controller 610 may determine that the remaining life is longer as the value of second ratio R2 is closer to 1 and determine that the remaining life is shorter as the value is closer to 0.

According to an exemplary embodiment, the controller 610 may estimate the remaining life of the battery 640 based on the first ratio R1 calculated according to math FIG. 2 or the second ratio R2 according to math FIG. 3, whichever is smaller.

FIG. 10 is a flowchart of a method of estimating battery life of an aerosol generating device according to an exemplary embodiment.

In operation S1010, the aerosol generating device may measure an initial output voltage of a battery after charging is completed.

In operation S1020, the aerosol generating device may determine the number of available usage times of the aerosol generating device based on the initial output voltage of the battery.

In operation S1030, the aerosol generating device may count the number of usage times of the aerosol generating device.

In operation S1040, the aerosol generating device may estimate the remaining life of the battery based on an estimated current consumption of the aerosol generating device according to the number of usage times counted in operation S1030 and an estimated initial current capacity of the aerosol generating device according to the number of available usage times of the aerosol generating device determined in operation S1020. In operation S1040, the remaining life of the battery may be estimated by comparing a sum of the estimated current consumption of the aerosol generating device according to the counted number of usage times and a current consumed during a standby time of the aerosol generating device, with the estimated initial current capacity of the aerosol generating device according to the determined number of available usage times of the aerosol generating device.

FIG. 11 is a flowchart of a method of estimating battery life of an aerosol generating device according to an exemplary embodiment.

In operation S1110, the aerosol generating device may measure an initial output voltage of a battery after charging is completed.

In operation S1120, the aerosol generating device, may count the number of usage times of the aerosol generating device.

In operation S1130, the aerosol generating device may measure an output voltage of the battery which has dropped from the initial output voltage after the counted number of usage times.

In operation S1140 the aerosol generating device may estimate the remaining life of the battery based on the initial output voltage of the battery and the dropped output voltage of the battery.

FIGS. 10 and 11 show that operations S1010 to S1040 and operations S1110 to S1140 are executed sequentially, respectively, but it is merely illustrative of the inventive concept of the present exemplary embodiment. One of ordinary skill in the art to which one or more exemplary embodiments pertain may modify the sequences shown in FIGS. 10 and 11 or make various modifications by executing one or more operations in parallel without departing from the inventive concept of one or more exemplary embodiments. Therefore, the sequences shown in FIGS. 10 and 11 are not limited to chronological sequences.

Also, descriptions given above with reference to FIGS. 6 to 9 may be identically applied to related operations of FIGS. 10 and 11.

At least one of the components, elements, modules or units (collectively "components" in this paragraph) represented by a block in the drawings such as the controller 12 and 610, the interface 620, and the counter 660 in FIGS. 1-3 and 6, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

According to one or more exemplary embodiments, a remaining battery life of an aerosol generating device may be effectively estimated, thereby preventing degradation of smoking quality due to degradation of performance of a battery beyond a certain level and maintaining constant smoking quality.

It should be understood that exemplary embodiments described, herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the disclosure a defined by the following claims.

The invention claimed is:

1. An aerosol generating device comprising:
a heater configured to generate aerosol by heating an aerosol generating substance;
a battery configured to supply power to the heater; and
a controller configured to estimate a remaining life of the battery based on at least two from among a first output voltage of the battery measured at a first time point, a second output voltage of the battery measured at a second time point that is later than the first time point, and a number of usage times of the aerosol generating device between the first time point and the second time point.

2. The aerosol generating device of claim 1, wherein the controller further configured to:
determine a number of available usage times of the aerosol generating device based on the first output voltage of the battery; and
estimate the remaining life of the battery based on an estimated current consumption according to the number of usage times and an estimated initial current capacity according to the number of available usage times.

3. The aerosol generating device of claim 2, wherein the controller is further configured to estimate the remaining life of the battery by comparing a sum of the estimated current consumption and a current consumed during a standby time of the aerosol generating device with the estimated initial current capacity.

4. The aerosol generating device of claim 1, wherein the controller is further configured to:
calculate a first voltage drop of the battery by subtracting the second output voltage from the first output voltage; and
estimate the remaining life of the battery based on the first voltage drop and a first estimated voltage drop corresponding to the number usage times.

5. The aerosol generating device of claim 4, wherein the first estimated voltage drop is determined in advance based on the first output voltage and the number of usage times of the aerosol generating device, and
wherein the first estimated voltage drop comprises a first maximum efficiency estimated voltage drop, which is an estimated voltage drop when the battery is at its peak performance, and a first minimum efficiency estimated voltage drop, which is an estimate voltage drop when the battery is at its lowest performance.

6. The aerosol generating device of claim 5, wherein the controller is further configured to:
calculate a first ratio, which is a ratio between a value obtained by subtracting the first voltage drop from the first minimum efficiency estimated voltage drop and a value obtained by subtracting the first maximum efficiency estimated voltage drop from the first minimum efficiency estimated voltage drop; and
estimate the remaining life of the battery based on the first ratio.

7. The aerosol generating device of claim 6, wherein the controller is further configured to:
calculate a second voltage drop of the battery by subtracting the minimum output voltage of the battery in a period in which the battery is discharged at a predetermined discharging rate or higher from the first output voltage; and
estimate the remaining life of the battery based on the second voltage drop and a second estimated voltage drop of the battery in the period in which the battery is discharged at the predetermined discharging rate or higher.

8. The aerosol generating device of claim 7, wherein the second estimated voltage drop is determined in advance based on the first output voltage and the predetermined discharging rate, and
wherein the second estimated voltage drop comprises a second maximum efficiency estimated voltage drop, which is an estimated voltage drop when the battery is at its peak performance, and a second minimum efficiency estimated voltage drop, which is an estimated voltage drop when the battery is at its lowest performance.

9. The aerosol generating device of claim 8, wherein the controller is further configured to:
calculate a second ratio, which is a ratio between a value obtained by subtracting the second voltage drop from the second minimum efficiency estimated voltage drop and a value obtained by subtracting the second maximum efficiency estimated voltage drop from the second minimum efficiency estimated voltage drop; and
estimate the remaining life of the battery based on a smaller value between the first ratio and the second ratio.

10. The aerosol generating device of claim 7, wherein the period in which the battery is discharged at the predetermined discharging rate or higher is a period in which the heater performs pre-heating.

11. A method of estimating battery life of an aerosol generating device, the method comprising:
measuring an initial output voltage of a battery;
determining a number of available usage times of the aerosol generating device based on the initial output voltage of the battery;
counting a number of usage times of the aerosol generating device; and
estimating the remaining life of the battery based on an estimated current consumption of the aerosol generating device according to the number of usage times and an estimated initial current capacity of the aerosol generating device according to the number of available usage times.

12. The method of claim 11, wherein the estimating of the remaining life of the battery comprises estimating the remaining life of the battery by comparing a sum of the estimated current consumption and a current consumed during a standby time of the aerosol generating device with the estimated initial current capacity.

13. A method of estimating battery life of an aerosol generating device, the method comprising:
measuring a first output voltage of a battery at a first time point;
counting a number of usage times of the aerosol generating device;
measuring a second output voltage of the battery at a second time point after the number of usage times; and
estimating the remaining life of the battery based on the first output voltage and the second output voltage.

14. The method of claim 13, further comprising calculating a first voltage drop of the battery by subtracting the second output voltage from the first output voltage,
wherein the estimating of the remaining life of the battery comprises estimating the remaining life of the battery based on the first voltage drop of the battery and a first estimated voltage drop that is estimated based on the number of usage times.

15. The method of claim 14, wherein the first estimated voltage drop is determined in advance based on the first output voltage and the counted number of usage times of the aerosol generating device, and
wherein the first estimated voltage drop comprises a first maximum efficiency estimated voltage drop, which is an estimated voltage drop when the battery is at its peak performance, and a first minimum efficiency estimated voltage drop, which is an estimated voltage drop when the battery is at its lowest performance.

16. The method of claim 15, further comprising calculating a first ratio, which is a ratio between a value obtained by subtracting the first voltage drop from the first minimum efficiency estimated voltage drop and a value obtained by subtracting the first maximum efficiency estimated voltage drop from the first minimum efficiency estimated voltage drop,
wherein the estimating of the remaining life of the battery comprises estimating the remaining life of the battery based on the first ratio.

17. The method of claim 16, further comprising calculating a second voltage drop of the battery by subtracting the minimum output voltage of the battery in a period in which the battery is discharged at a predetermined discharging rate or higher from the first output voltage,
wherein the estimating of the remaining life of the battery comprises estimating the remaining life of the battery based on the second voltage drop and a second estimated voltage drop of the battery in the period in which the battery is discharged at the predetermined discharging rate or higher.

18. The method of claim 17, wherein the second estimated voltage drop is determined in advance based on the first output voltage and the predetermined discharging rate, and
wherein the second estimated voltage drop comprises a second maximum efficiency estimated voltage drop, which is an estimated voltage drop when the battery is at its peak performance, and a second minimum efficiency estimated voltage drop, which is an estimated voltage drop when the battery is at its lowest performance.

19. The method of claim 18, further comprising calculating a second ratio, which is a ratio between a value obtained by subtracting the second voltage drop from the second minimum efficiency estimated voltage drop and a value obtained by subtracting the second maximum efficiency estimated voltage drop from the second minimum efficiency estimated voltage drop,
wherein the estimating of the remaining life of the battery comprises estimating the remaining life of the battery based on a smaller value between the first ratio and the second ratio.

20. The method of claim 17, wherein the period in which the battery is discharged at the predetermined discharging rate or higher is a period in which a heater included in the aerosol generating device performs pre-heating.

* * * * *